United States Patent
Vilsmeier et al.

(10) Patent No.: US 9,679,373 B2
(45) Date of Patent: Jun. 13, 2017

(54) RETROSPECTIVE MRI IMAGE DISTORTION CORRECTION

(75) Inventors: Stefan Vilsmeier, Munich (DE); Rainer Lachner, Munich (DE)

(73) Assignee: Brainlab AG, Munich (DE)

(*) Notice: Subject to any disclaimer, the term of this patent is extended or adjusted under 35 U.S.C. 154(b) by 364 days.

(21) Appl. No.: 13/983,121

(22) PCT Filed: Feb. 3, 2011

(86) PCT No.: PCT/EP2011/051563
§ 371 (c)(1),
(2), (4) Date: Aug. 1, 2013

(87) PCT Pub. No.: WO2012/103949
PCT Pub. Date: Aug. 9, 2012

(65) Prior Publication Data
US 2013/0315463 A1    Nov. 28, 2013

(51) Int. Cl.
*G06T 7/00* (2017.01)
*G01R 33/56* (2006.01)
(Continued)

(52) U.S. Cl.
CPC .......... *G06T 7/0012* (2013.01); *G01R 33/565* (2013.01); *G01R 33/5608* (2013.01);
(Continued)

(58) Field of Classification Search
None
See application file for complete search history.

(56) References Cited

U.S. PATENT DOCUMENTS

| | | |
|---|---|---|
| 5,005,578 A | 4/1991 | Greer et al. |
| 5,351,006 A | 9/1994 | Sumanaweera et al. |

(Continued)

FOREIGN PATENT DOCUMENTS

| | | |
|---|---|---|
| DE | 103 19 037 A1 | 11/2004 |
| JP | 2006141782 | 6/2006 |
| WO | 9956156 | 11/1999 |

OTHER PUBLICATIONS

Huang et al., "Correction of B0 susceptibility induced distortion in diffusion-weighted images using large-deformation diffeomorphic metric mapping", Magnetic Resonance Imaging, vol. 26, No. 9, Nov. 1, 2008, pp. 1294-1302.

(Continued)

*Primary Examiner* — Tsung-Yin Tsai
(74) *Attorney, Agent, or Firm* — Tucker Ellis LLP

(57) ABSTRACT

The invention relates to a method for correcting MRI image distortion, in which a distortion correction procedure is carried out on an acquired MRI image data set (1) of a body region by graphical data processing, characterized in that: —after the MRI image data set (1) has been acquired, its distortion is determined by carrying out an image registration process for registering the acquired MRI image data set (1) to a previously available, less distorted or undistorted image data set (2) of substantially the same body region; —a transformation is determined from the image registration process; and —by applying the transformation to the MRI image data set (1), its distortion is corrected.

20 Claims, 4 Drawing Sheets

(51) Int. Cl.
*G01R 33/565* (2006.01)
*G06T 7/33* (2017.01)

(52) U.S. Cl.
CPC .......... *G06T 7/33* (2017.01); *G01R 33/56563* (2013.01); *G01R 33/56572* (2013.01); *G06T 2207/10072* (2013.01); *G06T 2207/20016* (2013.01); *G06T 2207/30016* (2013.01)

(56) References Cited

U.S. PATENT DOCUMENTS

| | | | |
|---|---|---|---|
| 5,617,028 A | 4/1997 | Meyer et al. | |
| 7,535,227 B1* | 5/2009 | Koch | G01R 33/5616 324/307 |
| 9,076,201 B1* | 7/2015 | Negahdar | G06T 7/0012 |
| 2005/0024051 A1 | 2/2005 | Doddrell et al. | |
| 2006/0002615 A1* | 1/2006 | Fu | A61B 6/5235 382/254 |
| 2006/0002631 A1* | 1/2006 | Fu | G06K 9/3233 382/294 |
| 2007/0196007 A1* | 8/2007 | Chen | A61B 6/00 382/131 |
| 2007/0206880 A1* | 9/2007 | Chen | G06K 9/00 382/294 |
| 2007/0280556 A1* | 12/2007 | Mullick | G06T 5/50 382/294 |
| 2008/0247622 A1* | 10/2008 | Aylward | A61B 90/36 382/131 |
| 2009/0022385 A1 | 1/2009 | Ritter | |
| 2010/0054630 A1* | 3/2010 | Avinash | G06F 3/04845 382/294 |
| 2010/0259263 A1* | 10/2010 | Holland | A61B 5/055 324/310 |
| 2011/0019889 A1* | 1/2011 | Gering | A61B 6/032 382/131 |
| 2012/0259199 A1* | 10/2012 | Huwer | G01R 33/56341 600/410 |
| 2014/0079338 A1* | 3/2014 | Siewerdsen | G06T 3/0068 382/284 |
| 2014/0270451 A1* | 9/2014 | Zach | A61B 5/055 382/131 |

OTHER PUBLICATIONS

EPC Communication pursuant to Article 94(3) for European Application No. 11 703 426.4 dated Sep. 19, 2014.
International Search Report for International Application No. PCT/EP2011/051563 dated Oct. 17, 2011.
Doran et al., "A complete distortion correction for MR images: I. Gradient warp correction", Physics in Medicine and Biology, vol. 50, No. 7, Apr. 2005, pp. 1343-1361.
Likar et al., "A hierarchical approach to elastic registration based on mutual information", Image and Vision Computing, vol. 19, No. 1-2, Nov. 2000, pp. 33-44.
Merhof et al., "Correction of susceptibility artifacts in diffusion tensor data using non-linear registration", Medical Image Analysis, vol. 11, No. 6, Oct. 2007, pp. 588-603.
Meyer et al., "Retrospective Correction of Intensity Inhomogeneities in MRI", IEEE Transactions on Medical Imaging, vol. 14, No. 1, Mar. 1995, pp. 36-41.
Mistry et al., "Retrospective Distortion Correction for 3D MR Diffusion Tensor Microscopy Using Mutual Information and Fourier Deformations", Magnetic Resonance in Medicine, vol. 56, No. 2, Jun. 2006, pp. 310-316.
Poynton et al., "Fieldmap-Free Retrospective Registration and Distortion Correction for EPI-Based Functional Imaging", Medical Image Computing and Computer-Assisted Intervention, Sep. 2008, pp. 271-279.
Thompson et al., "Anatomically Driven Strategies for High-Dimensional Brain Image Warping and Pathology Detection", Brain Warping, Jan. 1999, pp. 311-336.
Vemuri et al., "Image registration via level-set motion: Applications to atlas-based segmentation", Medical Image Analysis, vol. 7, No. 1, Mar. 2003, pp. 1-20.
Wu et al., "Comparison of EPI Distortion Correction Methods in Diffusion Tensor MRI Using a Novel Framework", Medical Image Computing and Computer-Assisted Intervention, Sep. 2008, pp. 321-329.

* cited by examiner

RETROSPECTIVE MRI IMAGE DISTORTION CORRECTION

This application is a national phase of International Application No. PCT/EP2011/051563 filed Feb. 3, 2011 and published in the English language.

The present invention relates to a method for correcting MRI image distortion, in which a distortion correction procedure is carried out on an acquired MRI image data set of a body region, in particular by means of graphical data processing carried out on a computer unit or a medical treatment planning system or a medical navigation system.

Magnetic resonance imaging (MRI) is a non-invasive in-vivo imaging modality which can for example differentiate between different tissue types within the human brain. MR images are known to be geometrically distorted both because of gradient non-linearity and imperfections in the B0 field, the latter caused by an imperfect main magnet geometry or by patient-induced distortion (susceptibility artefacts). Typically, the distortion magnitude depends on the MR pulse sequence used and has a range of several millimeters (and in rare cases even several centimeters).

A non-constant B0 field can for example be counteracted using correction coils (shimming), and a gradient-reversal method exists for correcting patient-induced B0 inhomogeneities (Chang H and Fitzpatrick J M, 1992, IEEE Trans. Med. Imaging 11 319-29). Geometric distortions due to non-linear gradients can be corrected by a combination of a calibration phantom and direct field mapping (Doran S J, Charles-Edwards L, Reinsberg S A, Leach M O, 2005; A complete distortion correction for MR images: I. Gradient warp correction. PHYSICS IN MEDICINE AND BIOLOGY, 50 (7) 1343-1361).

For diffusion tensor imaging in particular, several articles suggest distortion correction by means of elastic registration (see for example Merhof D, Soza G, Stadlbauer A, Greiner G, Nimsky C, 2007; Correction of susceptibility artifacts in diffusion tensor data using non-linear registration. Medical image analysis 11(6): 588-603).

US 2009/022385 A1 discloses a method for correction of distortion in image data records recorded by means of a magnetic resonance scanner. B0 inhomogeneities are corrected by acquiring, within a single imaging instance, two scans exhibiting different frequency coding gradients. These scans are registered, and a correction shift field is calculated and used for correcting distortions.

WO 9956156 teaches another, quite similar way of correcting distortion due to B0 inhomogeneities, in which two images with different phase coding are acquired in the same imaging instance, and the actual B0 field is calculated from their phase difference, whereupon said actual B0 field is used to find a correct image.

In another similar document, U.S. Pat. No. 5,351,006 discloses a method and an apparatus for correcting spatial distortion in magnetic resonance images due to magnetic field inhomogeneity, including inhomogeneity due to susceptibility variations, wherein knowledge of phase differences at each position (obtained by two scans of the same or a single imaging instance exhibiting different phase coding) can be used to estimate the actual susceptibilities and calculate susceptibility-corrected images.

JP 2006-141782 (A) describes a magnetic resonance imaging apparatus correction in which systematic distortions (but not patient-induced distortions) are corrected by using a calibration phantom having a known geometry to calculate a distortion field.

One method according to US 2005/024051 A1 corrects distortions due to non-linear gradients using representations of the gradients by means of spherical harmonics. Coefficients of the spherical harmonics are obtained by a priori measurements and numerical fitting. The method compensates for gradient-induced distortions only.

For EPI sequences in particular, DE 103 19 037 A1 discloses a method for correcting image distortion in magnetic resonance tomography by using two or more images, obtained from different echoes arising from a single excitation pulse, to determine an image correction based on their evaluation. It is proposed that "correction images" be acquired at different echo times after an RF pulse. A distortion-correction image is computed from the sum of these correction images.

Similarly, U.S. Pat. No. 5,617,028 suggests a way of correcting magnetic field inhomogeneity in MRI, wherein a B0 field which is inhomogeneous due to varying susceptibilities is corrected. The method uses an estimated linear magnetic field map (phase images at different echo times) which allows the actual B0 values within the imaged object to be estimated.

A three-dimensional magnetic resonance image distortion correction method and system for correcting any kind of MRI distortion is known from U.S. Pat. No. 5,005,578. A patient has to wear a helmet with multiple "MRI-sensitive" rods, from which the total distortion can be estimated.

It is an object of the present invention to provide an optimised method for correcting MRI image distortion. This object is achieved by a method for correcting MRI image distortion in accordance with claim 1. The sub-claims define advantageous embodiments of the invention.

In the method for correcting MRI image distortion in accordance with the present invention, a distortion correction procedure is carried out on an acquired MRI image data set of a body region. The following steps are carried out:

after the MRI image data set has been acquired, its distortion is determined by carrying out an image registration process for registering the acquired MRI image data set to a previously available, (definitively) less distorted or undistorted image data set of substantially the same body region;

a transformation is determined from the image registration process; and by applying the transformation to the MRI image data set, its distortion is corrected.

Specifying that the distortion is determined after the MRI image data set has been acquired, and/or specifying that the acquired MRI image data set is registered to a previously available data set, clearly suggests that the method of the present invention is a "retrospective" distortion correction method as opposed to known "prospective" methods from the prior art. In other words, the method of the present invention uses data which have been made available beforehand in order to correct the currently acquired image data. This is different from the prior-art approaches which use a "prospective" method, i.e. which try to determine (and in some cases simultaneously correct) distortions while the current image data set is being produced or on the basis of information about the manner in which the image data are acquired, for example information about the distortion properties of the MRI scanner (as detected by calibration phantoms or different scans using different settings during a single imaging instance/session).

The retrospective nature of the method of the present invention enables the cumbersome step of determining the distortion properties of the MRI scanner used to be omitted, because it does not depend on processing such information. Instead, the present invention advantageously utilises the fact that it is highly probable in certain cases that a previously acquired image data set is already available. In the field of cranial applications in particular, earlier image data sets of a patient such as may have been acquired for different purposes are usually available (for example, an earlier CT-image data set acquired in order to provide detailed information about bone structures).

Thus, the present invention makes it possible to quantify and correct the distortion in one stand-alone MRI scan per imaging instance/session, thus eliminating the need to know the distortion characteristics of the particular MRI scanner used, i.e. the present invention does not require information about applied pulse sequences, gradient directions, phase encodings, echo times, etc. and there is therefore no need to use a calibration phantom. The method of the present invention can correct any MRI distortion, both due to inhomogeneous B0 fields and/or non-constant gradients, because it uses image data alone to identify and correct the distortion by registering a distorted MRI scan to another (less distorted or ideally undistorted) anatomical scan of the same object. In other words, by using previously acquired scan data which are available in most cases anyway, the present invention is able to provide a distortion correction method which is independent of the MRI scanner used.

Using the information from the DICOM header of the image is not essential, but could potentially improve the robustness and/or quality of the method.

The less distorted or undistorted image data set can be an image data set acquired beforehand in a separate, stand-alone image acquisition process, in particular by means of one or more of:
    another imaging modality;
    another imaging device; or
    an earlier imaging instance.

In other words, the less distorted or undistorted image data set is—in relation to the MRI image to be corrected—another data set or a different data set from an earlier data acquisition process, i.e. the two image data sets to be registered in accordance with the method of the present invention were not produced in the same image data acquisition process but rather in two or more image data acquisition processes.

Moreover, the less distorted or undistorted image data set can be an image data set acquired beforehand as a CT data set, a separate distortion-corrected MRI data set (i.e. a less distorted or undistorted MRI data set), an X-ray data set, a PET data set or a SPECT data set, in particular a cranial image data set. The use of any of these data sets can have its own advantages. For example, if a CT data set is registered to the MRI data set to be corrected, the method can rely on an extended amount of data, since CT imaging can detect structures which cannot be detected using MRI or vice versa. On the other hand, if two MRI data sets are registered to each other, registration can be based on image data portions which can be positively and uniquely identified in both data sets because of their sensitivity to the same body structures.

As mentioned above, the distortion correction method of the present invention can be based solely on image data, i.e. image data alone can be used and will be sufficient for correcting a distortion.

Within the framework of the present invention, the transformation derived from the registration process can be a non-linear geometric transformation which represents an image deformation from which a distortion magnitude can be calculated.

In accordance with one embodiment, anatomical atlas data are registered to the less distorted or undistorted image data set in order to identify certain body structures on which the registration process is to be carried out.

The registration process can comprise a multitude of single registrations, including global and/or local and/or rigid and/or elastic registrations, wherein the transformation is determined from a combination of two or more of these registrations. The registration process can also comprise a multitude of single registrations which are carried out in steps on different, separate anatomical structures within the body region. The registration process can also comprise a multitude of single registrations of structures within the body region, which are carried out in steps hierarchically, wherein the more rigid structures, for example bony structures, are registered first, before the softer structures, for example soft tissue, i.e. in the particular case of a head, the base of the skull first, then the calvarium, and then the cortex. The elasticity of the structures, in particular as determined by means of an anatomical atlas, can then be taken into account.

In one detailed embodiment of the present invention, one or more or all of the following steps are performed in order to correct the distortion in an MRI image data set:
    registering an anatomical atlas to the less distorted or undistorted image data set in order to identify certain structures of interest;
    performing a global, rigid registration of the MRI image data set and the less distorted or undistorted image data set;
    performing a first local, rigid registration of the MRI image data set and the less distorted or undistorted image data set on the basis of a first, in particular more rigid structure;
    performing a second local, rigid registration of the MRI image data set and the less distorted or undistorted image data set on the basis of a second, in particular less rigid structure which is spaced apart from the first structure;
    performing a first local, elastic registration of the MRI image data set and the less distorted or undistorted image data set in an area containing definitively rigid anatomical structures as determined by means of the anatomical atlas and the immediate surroundings of said rigid structures;
    performing a local, elastic registration of the MRI image data set and the less distorted or undistorted image data set on the basis of cutting edges of structures cut by a surface, in particular a curved surface, within the body region, wherein said surface is determined by means of the anatomical atlas;
    combining the result of the first and second local, rigid registrations and the first and second local, elastic registrations, to yield an intermediate transformation map;
    carrying out one or both of the following steps, in a suitable order and on the basis of the intermediate transformation map, to yield a pure deformation field:
        interpolating a dense deformation field for intermediate areas in which the above registrations cannot be applied;
        eliminating any identified non-zero, rigid deformation parts;
    calculating a distortion magnitude map, which represents the transformation, from the pure deformation field;

applying the transformation to the MRI image data set in order to yield a distortion-corrected MRI image data set.

The present invention also relates to a program which, when it is running on a computer or is loaded onto a computer, causes the computer to perform a method as mentioned in the embodiments described above. The computer can be a computer unit of a medical treatment planning system or a medical navigation system, or it can be the graphical data processing unit of any such system. In this respect, it should be mentioned that the method of the present invention can of course be carried out using graphical data processing.

The invention also relates to a computer program storage medium which comprises a computer program as mentioned above.

Figure 1:
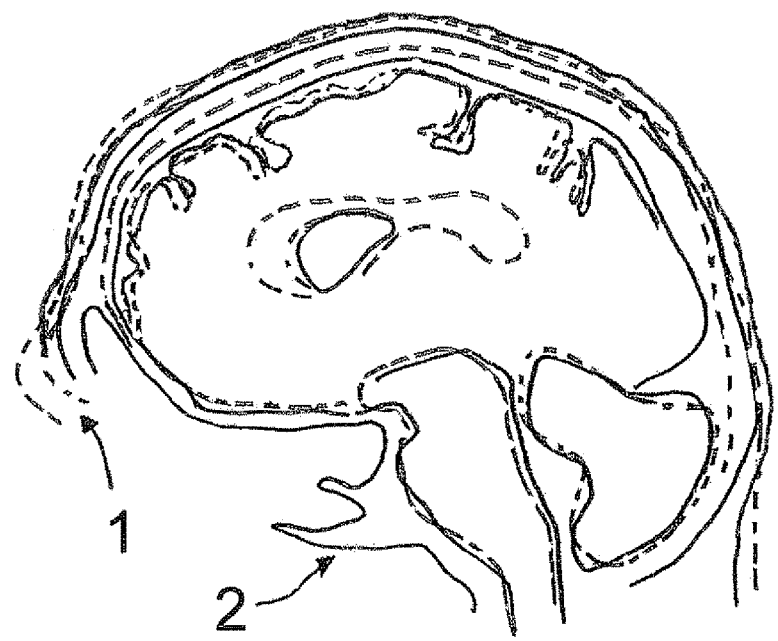
FIG. 1 shows a representative embodiment of an MRI scan in accordance with the invention.

The invention will now be described in more detail by referring to a particular embodiment and to the attached drawings. It is to be noted that each of the features of the present invention, as referred to in this document, can be implemented separately or in any expedient combination. In the drawings, FIGS. 1 to 8 show cortical structures and registration aids for illustrating the step-by-step process of registering an MRI image data set to a CT data set and for finding, using this process, a transformation for correcting the distortions in the MRI image data set.

The input of the distortion correction method illustrated by FIGS. 1 to 8, which represents but one embodiment of the present invention, is a potentially distorted MRI scan (image data set). The data sets are represented in the figures by two-dimensional views, whereas the entire data sets will contain three-dimensional data of the patient's head; the two-dimensional views are merely used in order to more simply illustrate the method of the invention in the present specification. It is however conceivable within the framework of the present invention to perform the distortion correction method on or using two-dimensional data sets/views/projections.

In FIG. 1, the above-mentioned potentially distorted MRI scan is represented by broken lines and is identified by the reference numeral 1. Reference numeral 2 denotes the second input into the distortion correction method of the present invention, namely a less distorted or preferably undistorted three-dimensional scan—in the present case, a CT scan of the same anatomical region, i.e. the patient's head. As can be seen in FIG. 1, the two image data sets do not match, one of the main reasons for this being the distortion in the MRI data set with respect to the undistorted CT data set.

In this embodiment, an additional input is provided by an anatomical atlas of the imaged region of the patient. Using the aforementioned anatomical atlas involves an additional step which is carried out prior to the steps explained by means of the figures, namely the step of registering the anatomical atlas to the CT data set, which allows certain regions to be roughly identified such as the skull base, the ventricles, etc. which can later be used as registering aids.

As shall be explained with reference to FIGS. 1 to 8, the following steps are then carried out:

A global rigid registration of the MR image 1 and the CT image 2 is performed, for example using an automatic intensity-based image registration algorithm. Similarity values are calculated within a standard region of interest (ROI) which includes the entire cranium. Due to the MRI distortion, a globally accurate registration result is not possible, i.e. when the CT image 2 and the MR image 1 are superimposed, corresponding structures will not match perfectly. This is the situation shown in FIG. 1, in which the solid lines represent the CT image 2 and the broken lines represent the MR image 1. Nevertheless, this is the best global result which can be achieved using a rigid image registration method. Deviations between corresponding structures will be within the order of magnitude of the MRI distortion at most.

This result is the starting point for the following local registrations.

Figure 2:
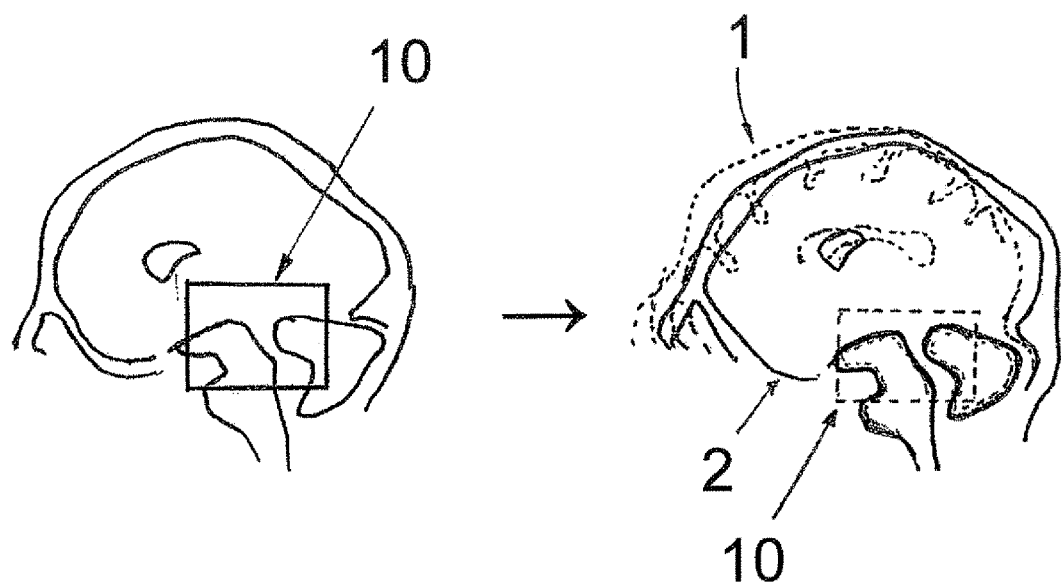
FIG. 2 shows a representative embodiment of an MRI scan with a region of interest located at the skull base in accordance with the invention.

A first local rigid registration of the MR image 1 and the CT image 2 is performed, Similarity values are calculated within a smaller ROI 10 located at the skull base, as shown in FIG. 2. B0 distortion and gradient-induced MRI distortion are typically minimal in this region, as is deformation of the brain itself between acquisition of the CT image 2 and the MRI image 1. Registration errors in the ROI 10 are therefore close to zero.

This can be referred to as the first reference registration.

Figure 3:
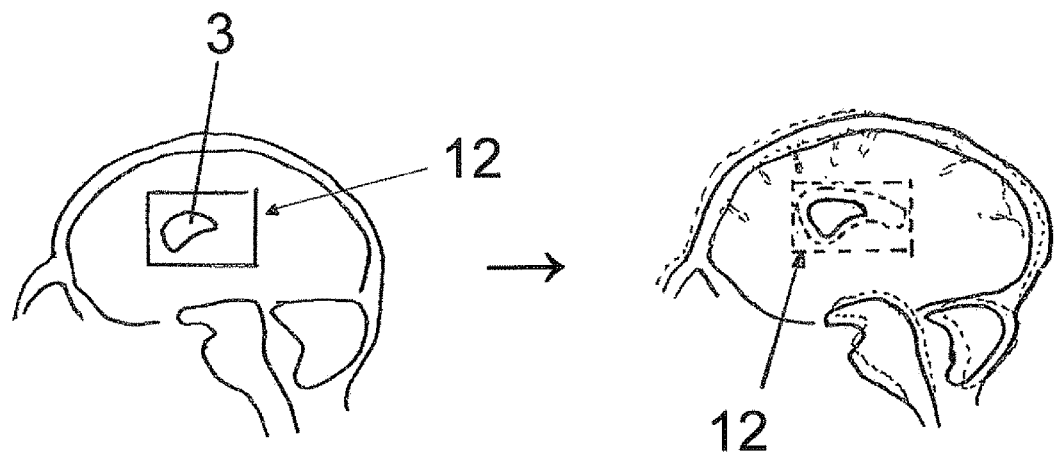
FIG. 3 shows a representative embodiment of an MRI scan with a region of interest located around the lateral ventricles in accordance with the invention.

A second local rigid registration of the MR image 1 and the CT image 2 is performed. Similarity values are calculated within a ROI 12 around the lateral ventricles 3, as shown in FIG. 3. B0 distortion and gradient-induced MRI distortion are also typically minimal in this region. Moreover, ventricles can be clearly identified in both CT and MR images. (Potential registration errors may be due to changes in CSF capacity between CT acquisition and MRI acquisition; these errors are however much smaller than typical MRI distortions.)

This can be referred to as the second reference registration. (It is also possible to treat the left and right lateral ventricle separately, thus yielding a third reference registration).

Anatomical structures which are guaranteed to be rigid, preferably the bones of the skull, are identified using the atlas. These bones are clearly visible in CT images. In MR images, they are indirectly visible (i.e. the bones are very dark, while adjacent structures are much brighter). An ROI 13 (FIG. 4) is defined which includes the skull bones 4 and extends several millimeters inwards and outwards (for example by morphological dilation of the skull bones). Typically, this region will also include the surface of the scalp on the outside and parts of the gyri/sulci 5, 6 on the inside.

Figure 4:
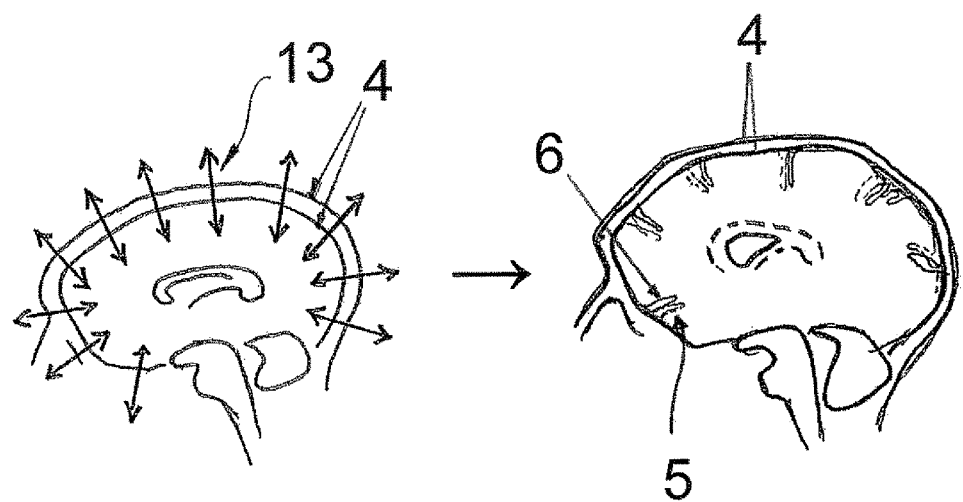
FIG. 4 shows a representative embodiment of an MRI scan with a region of interest which includes the skull bones in accordance with the invention.

A local elastic image registration is performed on this ROI 13 (see FIG. 4, left-hand side). In order to increase robustness, only radial deformations (i.e. perpendicular to the bone surface) and "stiff elasticity" (strong connectivity between neighbouring voxels) are allowed. This yields a local registration result which matches the bones within the ROI.

The results of the (first, second, etc.) reference registrations and the local elastic registration on the skull bones are combined. Resampling the MRI according to this combination would yield a temporary MR image which closely matches the CT image at the skull base, around the ventricles and on the skull bones (see FIG. 4, right-hand side). However, residual registration errors reveal themselves in the mismatches between corresponding gyri and sulci 5, 6. Moreover, the direction of the error vectors is tangential with respect to the skull bones 4. The temporary MRI mentioned may or may not be explicitly reconstructed.

Figure 5:
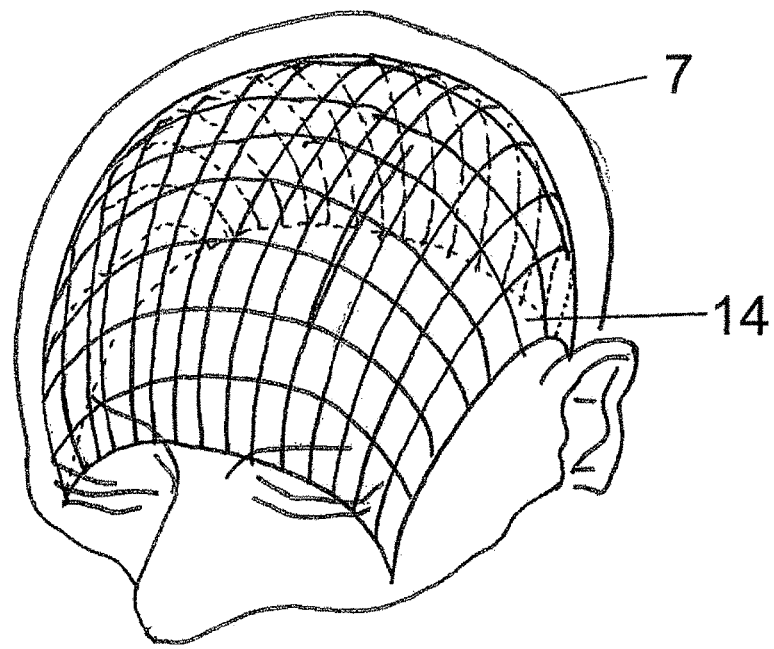
FIG. 5 shows a representative embodiment of a curved surface identified within the cranial cavity in accordance with the invention.
Figure 6:
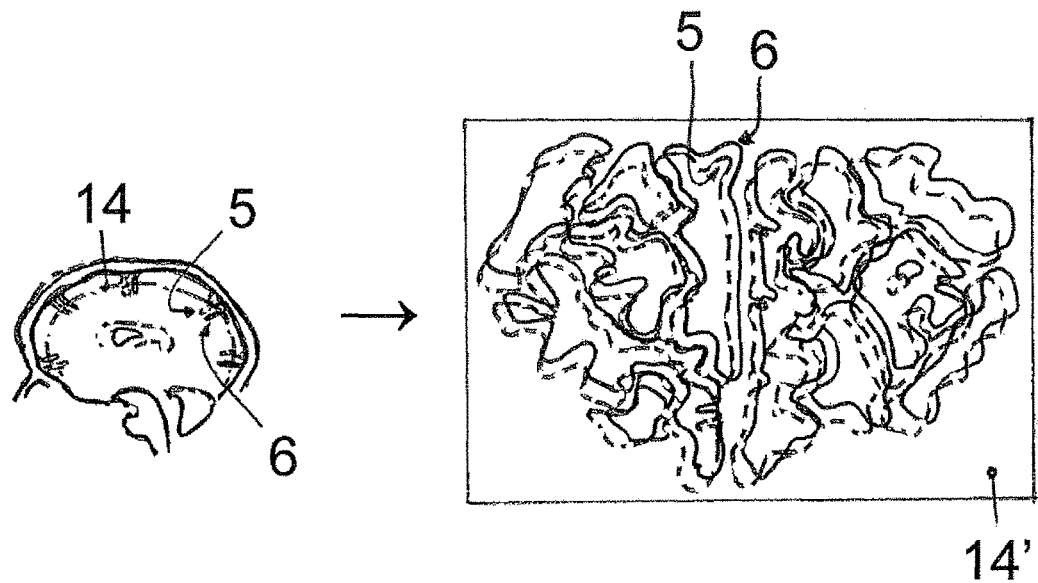
FIG. 6 shows a representative embodiment of a curved surface identified within the cranial cavity in accordance with the invention.

Using the atlas, a curved surface 14 is identified within the cranial cavity 7, parallel to the inner surface of the skull and intersecting the gyri and sulci 5, 6 as can be seen in FIGS. 5 and 6 (left-hand side). Both the CT image and the MR image are reconstructed along this surface 7 (the MR image from the temporary result of the previous step).

The right-hand side of FIG. 6 shows a sketch of a superimposed image mapped back onto the image plane. The corresponding gyri/sulci 5, 6 are clearly identifiable, but are displaced with respect to each other.

This displacement is corrected by using elastic image fusion (either in the mapped 2D image or directly tangential to the curved surface chosen).

In order to increase robustness, a stack consisting of a few adjacent parallel curved surfaces can be used (like onion skins).

This yields a result which keeps bones on bones and corrects the tangential gyri/sulci mismatches.

The results of the (first, second, etc.) reference registrations and the local elastic registrations from the previous two steps are combined. This combined transformation accurately maps both the skull base regions and the ventricle regions to their counterparts. It also maps bones onto bones and corresponding gyri/sulci onto each other.

Unfortunately, due to the limited differentiation capability of CT imaging in the grey matter/white matter region, elastic image registration cannot be used to determine the displacement in said region. However, the fact that MRI distortion varies slowly with respect to position justifies an interpolation of the transformation in this region. Any interpolation strategy (for example thin plate splines) can be used to calculate a dense deformation field 15 such as that shown in the left-hand depiction of FIG. 7.

Figure 7:
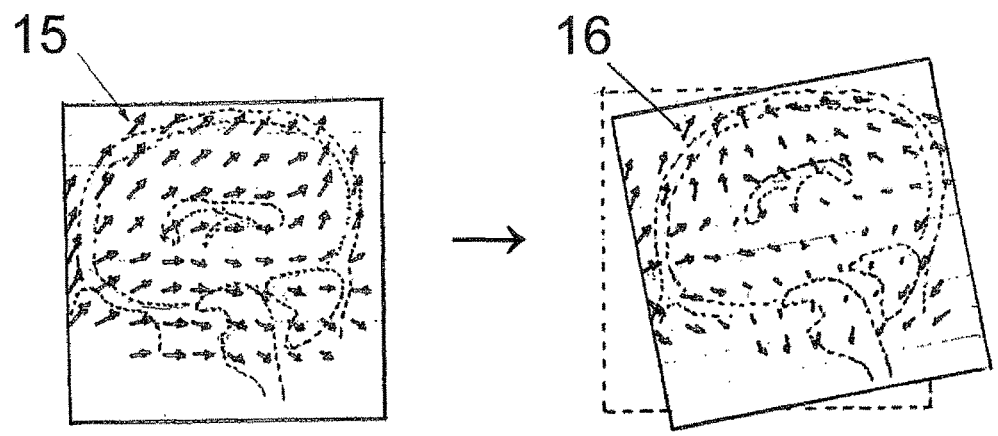
FIG. 7 shows a representative embodiment of a deformation field in accordance with the invention.

The deformation field 15 obtained will likely contain a non-zero rigid part which can be identified and subtracted from the deformation field 15 obtained, see FIG. 7, right-hand side. (It is also possible (and in some cases may be preferable) to eliminate the rigid part prior to calculating the dense deformation field 15).

The remaining deformation field 16 represents the MRI distortion alone.

Figure 8:
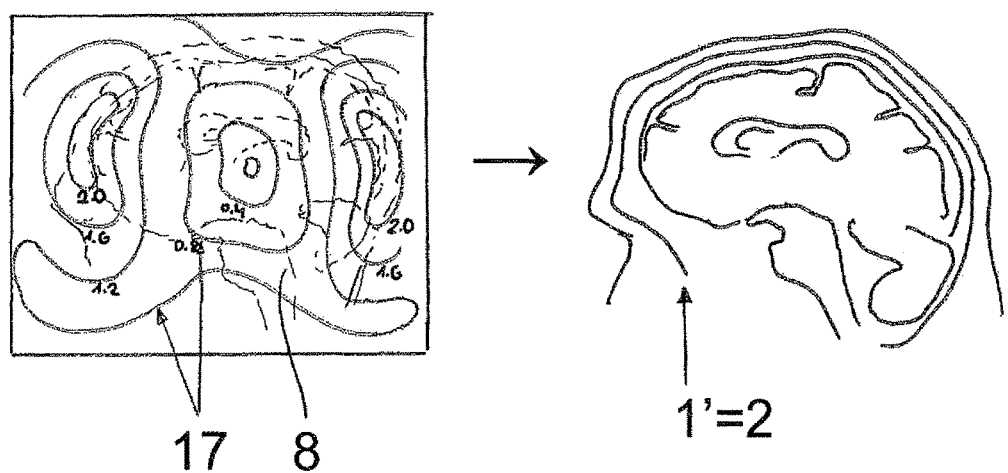
FIG. 8 shows a representative embodiment of a distortion magnitude map and a corrected MRI image in accordance with the invention.

A distortion magnitude map, such as that shown in the left-hand depiction of FIG. 8, is calculated from the pure deformation field 16 obtained. Said map comprises lines 17 of constant distortion magnitude which overlie body structures 8. The same information allows a corrected MRI image 1', such as can be seen in FIG. 8 on the right-hand side (corresponding to the CT image 2) to be calculated.

The output of this embodiment of the method according to the present invention thus consists of a 3D map depicting the magnitude of the geometric MRI distortion and a second, distortion-corrected MRI scan 1' (having the same frame of reference as the original scan). This second scan 1' is the result of a non-linear geometric transformation applied to the original MRI scan 1.

There are many applications for the present invention. Since distortions are ubiquitous in magnet resonance imaging, and since MRI is prevalent throughout medical planning and navigation applications, many of these applications would potentially benefit from a retrospective method which enables these distortions to be corrected.

In radiotherapy, for example, it is common procedure to acquire both CT and MR images. CT imaging is used for calculating doses, whereas planning target volumes such as tumours are identified using MR imaging due to its superior differentiation of soft tissues. A distortion-corrected MR scan in combination with a good image fusion method leads to a higher level of confidence with respect to the planning target volume. This can result in tighter safety margins around tumours, better tumour dose coverage and reduced irradiation of organs at risk.

In neuronavigation, zero-touch patient registration by means of light points projected or beamed onto the skin or surface of the patient is becoming increasingly popular due to its ease of use. Unfortunately, susceptibility-induced distortion in particular manifests itself mainly at the air-skin interface (the very region used in such registration), resulting in potentially erroneous registration image results. The present invention allows the magnitude of registration errors to be quantified in cases where a CT image is also available. Thus, it would be possible to correct an MRI distortion according to the disclosed procedure, but it would also be possible to correct distortions in other imaging or registration procedures (such as zero-touch, projected-light-point-based patient registration, matching or X-ray, CT, SPECT and/or PET imaging).

Fibre tracking and BOLD MRI mapping rely on the rapid acquisition of multiple scans using fast EPI sequences. EPI is prone to non-linear-gradient-induced MRI distortions. Most of the distortions can be corrected using state-of-the-art methods, but residual distortions may still cause problems. Other, less distorted anatomical MRI scans usually are available. These can be used in accordance with the procedure of the present invention in order to improve the geometric accuracy of the EPI scans.

The invention claimed is:

1. A method for correcting MRI image distortion, in which a distortion correction procedure is carried out on an acquired MRI image data set of a body region by graphical data processing, comprising:

determining the distortion the acquired MRI image data set, comprising both bony structure and soft tissue as a single image dataset, by carrying out an image registration process for registering the acquired MRI image data set to a previously available, less distorted or undistorted image data set of substantially the same body region, the registration process comprising a multitude of single registrations of structures within the body region that are performed based on a hierarchy, wherein bony structures shown in the MRI image data set are registered to the previously available less distorted or undistorted image data set first, whereupon soft tissue shown in the MRI image data set are registered to the previously available less distorted or undistorted image data set after the registration of the bony structures;

determining a transformation from the image registration process; and correcting the distortion by applying the transformation to the acquired MRI image data set.

2. The method according to claim 1, wherein the less distorted or undistorted image data set is an image data set acquired beforehand in a separate, stand-alone image acquisition process.

3. The method according to claim 2, wherein the less distorted or undistorted image data set is an image data set acquired by means of one or more of:
another imaging modality;
another imaging device; or
an earlier imaging instance.

4. The method according claim 1, wherein the less distorted or undistorted image data set is an image data set acquired beforehand as a CT data set, a separate distortion-corrected MRI data set, an X-ray data set, a PET data set or a SPECT data.

5. The method according to claim 4, wherein the less distorted or undistorted image data set is a cranial image data set.

6. The method according to claim 1 wherein image data alone are used to carry out the distortion correction procedure.

7. The method according to claim 1, wherein the transformation derived from the registration process is a non-linear geometric transformation which represents an image deformation from which a distortion magnitude can be calculated.

8. The method according to claim 1, wherein anatomical atlas data are registered to the less distorted or undistorted image data set in order to identify certain body structures on which the registration process is to be carried out.

9. The method according to claim 1, wherein the registration process further comprises a multitude of single registrations, including global and/or local and/or rigid and/or elastic registrations, and, wherein the transformation is determined from a combination of two or more of these registrations.

10. The method according to claim 1, wherein the registration process comprises a multitude of single registrations that are carried out in steps on different, separate anatomical structures within the body region.

11. The method according to claim 1, wherein the base of the skull is registered first, then the calvarium, and then the cortex.

12. The method according to claim 11, wherein the elasticity of the structures is taken into account in the distortion correction procedure.

13. The method according to claim 12, wherein the elasticity of the structures is determined by means of an anatomical atlas.

14. The method according to claim 1, further comprising:
acquiring an anatomical atlas that is registered to a previously less distorted or undistorted image data set in order to identify certain structures of the body region of interest.

15. The method according to claim 14, wherein one or more or all of the following steps are performed in order to correct the distortion in the acquired MRI image data set:

performing a global, rigid registration of the acquired MRI image data set and the less distorted or undistorted image data set;

performing a first local, rigid registration of the acquired MRI image data set and the less distorted or undistorted image data set on the basis of a first bony structure;

performing a second local, rigid registration of the acquired MRI image data set and the less distorted or undistorted image data set on the basis of a second soft tissue which is spaced apart from the first bony structure;

performing a first local, elastic registration of the acquired MRI image data set and the less distorted or undistorted image data set in an area containing definitively rigid anatomical structures as determined by means of the anatomical atlas and the immediate surroundings of said rigid structures;

performing a local, elastic registration of the MRI image data set and the less distorted or undistorted image data set on the basis of cutting edges of structures cut by a surface within the body region, wherein said surface is determined by means of the anatomical atlas;

combining the result of the first and second local, rigid registrations and the first and second local, elastic registrations, to yield an intermediate transformation map;

carrying out one or both of the following steps, in a suitable order and on the basis of the intermediate transformation map, to yield a pure deformation field;

interpolating a dense deformation field for intermediate areas in which the above registrations cannot be applied; and eliminating any identified non-zero, rigid deformation parts.

16. The method according to claim 15, wherein the surface is a curved surface.

17. The method according to claim 15, further comprising:
calculating a distortion magnitude map, which represents the transformation, from the pure deformation field; and
applying the transformation to the acquired MRI image data set in order to yield a distortion-corrected MRI image data set.

18. A non-transitory computer readable computer storage medium which comprises a computer program which, when running on a computer or loaded onto a computer, performs a graphical data processing method for correcting MRI image distortion comprising:

acquiring an MRI image data set of a body region;

determining the distortion of the acquired MRI image data set, comprising both bony structure and soft tissue as a single image dataset, by carrying out an image registration process for registering the acquired MRI image data set to a previously available less distorted or undistorted image data set of substantially the same body region, the registration process comprising a multitude of single registrations of structures within the body region that are performed based on a hierarchy, the hierarchy comprising a progression from bony structures to soft tissue structures yielding a pure deformation field by carrying out one or more of the following steps:

a) calculating a dense deformation field for intermediate areas in which the above registrations cannot be applied; or b) eliminating any identified non-zero, rigid deformation parts;

determining a transformation from the image registration process and the pure deformation field; and correcting the distortion by applying the transformation to the acquired MRI image data.

19. A non-transitory computer-readable storage medium having stored thereon computer-executable instructions that, when executed, configure a processor to:

register an acquired MRI image data set, comprising both bony structure and soft tissue as a single image dataset to a previously available, less distorted or undistorted image data set of substantially the same body region, wherein registering includes a multitude of single registrations of structures within the body region that are performed based on a hierarchy in which registering bony structures shown in the MRI image data set to the previously available less distorted or undistorted image data set is performed before registering soft tissue shown in the MRI image data set to the previously available less distorted or undistorted image data set;

determine a distortion of the acquired MRI image data set with the step of registering;

determine a transformation from the step of registering;

correct the distortion by applying the transformation to the acquired MRI image data set;

calculate a distortion magnitude map, which represents the transformation, from a pure deformation field; and apply the transformation to the acquired MRI image data set in order to yield a distortion-corrected MRI image data set.

20. A non-transitory computer-readable storage medium of claim 19, wherein the computer-executable instructions that, when executed, configure a processor to:

register an anatomical atlas to the less distorted or undistorted image data set in order to identify certain structures of the body of interest; and identify, by use of the anatomical atlas, anatomical structures which are guaranteed to be rigid.

* * * * *